(12) United States Patent
Dischiano

(10) Patent No.: US 6,239,481 B1
(45) Date of Patent: May 29, 2001

(54) DEVICE FOR REMOVING A FLIP CHIP DIE FROM PACKAGING

(75) Inventor: John Dischiano, Pfugerville, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/092,154

(22) Filed: Jun. 5, 1998

(51) Int. Cl.⁷ ........................................... H01L 23/48

(52) U.S. Cl. ........................... 257/678; 257/737; 257/778

(58) Field of Search ................ 257/678, 48, 690, 257/778, 737, 738

(56) References Cited

U.S. PATENT DOCUMENTS 5,147,084 * 9/1992 Behun et al. .......................... 257/48
5,475,236 * 12/1995 Yoshizaki .............................. 257/48

* cited by examiner

*Primary Examiner*—Carl Whitehead, Jr.
*Assistant Examiner*—Roy Potter

(57) ABSTRACT

A method and structure for accessing the circuit region on a flip chip die are provided. The method and device permit multiple portions of the circuit region to be tested and analyzed simultaneously or in sequence. Access to the circuit region is gained without deteriorating any portions of the circuit region through the process. In a similar fashion, the new method and device allow for the circuit region to be efficiently modified, or "debugged," and then returned into operation.

20 Claims, 2 Drawing Sheets

DEVICE FOR REMOVING A FLIP CHIP DIE FROM PACKAGING

RELATED APPLICATIONS

This application is related to the co-filed and commonly assigned applications; Ser. No. 09/092,674, filed Jun. 5, 1998, now U.S. Pat. No. 6,139,403, issued Oct. 31, 2000, entitled "Method and Device for Accessing Flip Chip Circuitry," 09/092,674, filed Jun. 5, 1998 entitled "Method and Device for Supporting Flip Circuitry under Analysis," 09/090,447, filed Jun. 4, 1998 entitled "An Alternate Method and Device for Removing A Flip Chip Die From Packaging," 09/092,164, filed Jun. 5, 1998 entitled "A Method and Device for A Flip Chip Die and Package Holder," which are hereby incorporated by reference.

1. Field of the Invention

The invention relates to semiconductor device assemblies, and more particularly to techniques for analyzing and debugging circuitry associated with a flip chip bonded integrated circuit.

2. Background of the Invention

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Flip chip technology answers the demand for improved input/output (I/O) connections from the chip to external systems. On a flip chip, the electrical components are located (face down) on the side of the die which attaches to the chip package. In this manner, the flip chip provides a short interconnection length using, for example, ball-grid array (BGA) solder connections. The self-aligning nature of the solder bumps offers the advantages of higher density mounting, improved electrical performance and reliability, and better manufacturability. The positioning of the circuit side is the source of many advantages in the flip chip design. However, in other regards, the orientation of the die with the circuit side face down on a substrate is a disadvantage.

In example, access to the circuit region is sometimes necessitated in order to modify or debug a finished chip. Additionally, access to the circuit region is often required through manufacturing stages in order to test and analyze circuit's integrity. In this event, it is necessary to burrow through the body of the flip chip die or through the chip package in order to access the circuit region.

Various methods have been employed to quickly and effectively access the circuit region. A popular method includes milling or grinding off portions of the die, or the chip packaging in order to burrow through to the circuit region. The difficulty lies in the accuracy of this method. Since the circuit region is formed in a very thin epitaxial layer, with a typical thickness of only 10–20 micrometers ($\mu$m), an overshoot in the milling process can grind through the very circuit for which the testing was intended. Conversely, slowly milling off portions of the chip package is inefficient for mass fabrication procedures.

For these reasons, it is necessary to uncover an alternative method and device for accessing the circuit region on a flip chip die. The new method and device should desirably permit multiple portions of the circuit region to be analyzed, yet leave the circuit region in a useable condition. A new method and device would similarly be desirable in which the circuit region could be debugged and then placed back in operation. Any work performed on the circuit should leave other portions of the circuit region intact so that they can be the subject of later analysis.

SUMMARY OF THE INVENTION

The above mentioned problems with integrated circuit technology and other problems are addressed by the present invention and will be understood by reading and studying the following specification. A device and method are described which accord these benefits.

In particular, an illustrative embodiment of the present invention includes a method for removing a flip chip die from a chip package. The method includes removing portions of the chip package from outside a circuit region of the flip chip die. A silicon carcass from a discarded die is attached as a backplate to the flip chip die. Heat is applied to the chip package. Then, the flip chip die is removed from the chip package.

In another embodiment, a device for accessing a circuit region on a flip chip die is provided. The device includes a chip package. The chip package has electrical connections to the circuit region. The chip package has no electrical pin connections for external device connection. A silicon carcass from a discarded die is attached as a backplate to the flip chip die. A heat source is in contact with the chip package.

In an alternative embodiment, a system for accessing a circuit region on a flip chip die is provided. The system includes a device for accessing the circuit region. The device includes a chip package. The chip package has electrical connections to the circuit region. The chip package has no electrical pin connections for external device connection. A silicon carcass from a discarded die is attached as a backplate to the flip chip die. A heat source is in contact with the chip package. The system further includes a controller which electrically couples to the heat source for controlling the operation of the heat source.

Thus an alternative method and device for accessing the circuit region on a flip chip die are provided. The new method and device facilitates the analysis of multiple portions of the circuit region and leaves other portions of the circuit intact such that they can later be analyzed. Access to the circuit region is gained without deteriorating any portions of the circuit region through the process. In a similar fashion, the new method and device allow for the circuit region to be modified, or "debugged," and then returned into operation.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The terms "front," "back," "front side," and "back side" as used in this application may be interchanged and are used principally to suggest a structural relationship with respect to one another. The term "horizontal" is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the structure discussed, regardless of the orientation of the structure.

FIGS. 1A–1D describe generally various steps of an embodiment for accessing the circuitry of a flip chip.

Figure 1A:
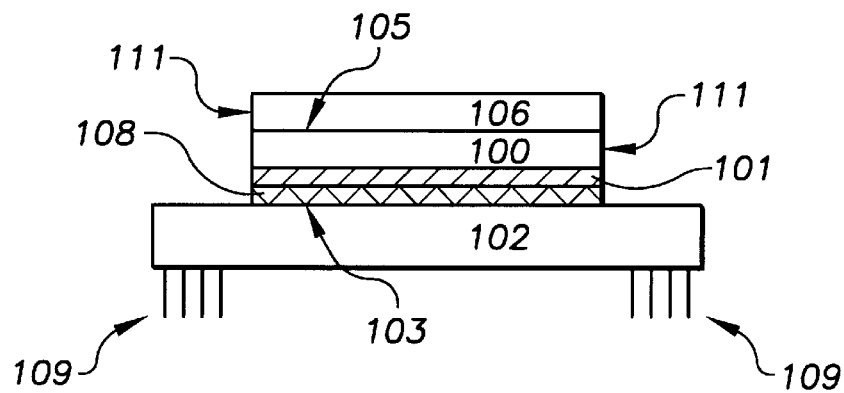
FIGS. 1A–1D show cross-sectional views of successive process steps for removing a flip chip die from packaging according to the present invention.

In FIG. 1A, the starting structure is illustrated. The structure includes a flip chip die 100. The flip chip die has a number of opposing edges 111. The flip chip die 100 includes a circuit region 101 located on a front side 103 of the flip chip die 100. The flip chip die 100 further is attached to a chip package 102. The chip package 102 includes electrical pin connections 109 located on portions of the chip package 102 outside of the circuit region 101. The flip chip die 100 is oriented such that the circuit region 101 is adjacent to, or "faces," the chip package 102. In one embodiment, the chip package 102 is formed from ceramic. In another embodiment, the chip package 102 is formed from any other suitable material for supporting and protecting the flip chip die 100 as well as facilitating electrical connections to the circuit region 101. In one embodiment the circuit region 101 is electrically connected to the chip package using a ball grid array (BGA) technique, as this method is well practiced in the art. In an alternative embodiment, the circuit region 101 of the flip chip die 100 is electrically connected using any other suitable method. Such alternative methods are well known and practiced by those skilled in the art. An underfill region 108 encases the circuit region 101 and fills the boundary between the circuit region 101 and the chip package 102.

The flip chip die 100 further includes a back side 105. A back plate 106 is attached to the back side 105 of the flip chip die 100. The back plate 106 comprises a silicon carcass salvaged from a discarded silicon die. Such silicon carcasses are remnants of old wafers, and therefore sufficiently available, often even pre-cut to the right size. Attachment of the back plate 106 to the back side 105 of the flip chip die 100 is achieved using any suitable adhesive, as such adhesive are generally used and known to those working in the semiconductor device analysis field.

Figure 1B:
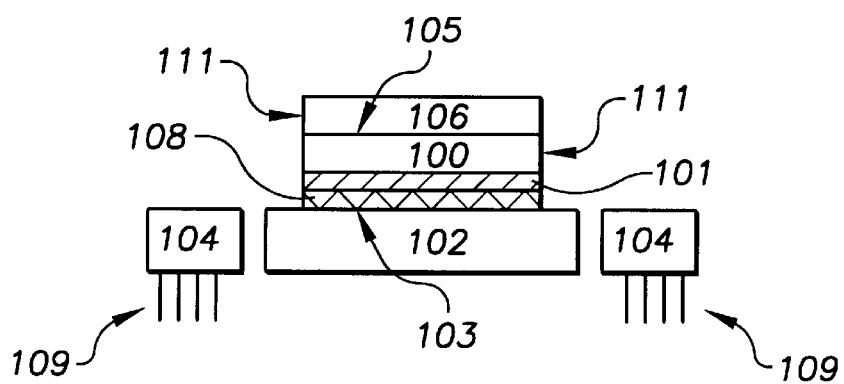

FIG. 1B illustrates the structure following the next sequence of events. Portions 104 are removed from the chip package 102. The removed portions 104 include the electrical pin connections 109. The portions 104 are removed from an area outside of the circuit region 101 of the flip chip die 100. In one embodiment, the portions 104 a diamond saw is used to remove the portions 104 from the chip package 102. In another embodiment, the portions 104 are removed using any suitable technique which does not harm the circuit region 101 of the flip chip die 100.

Figure 1C:
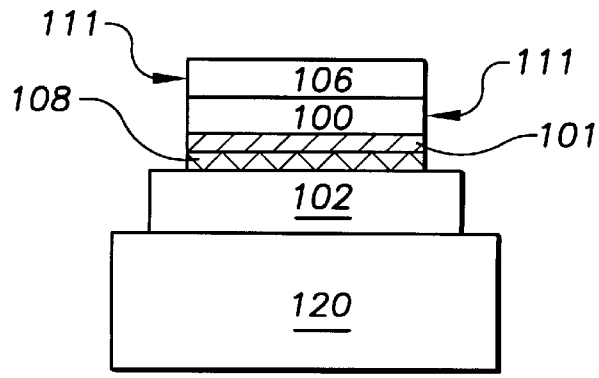

FIG. 1C illustrates the structure following the next sequence of steps. A heat source 120 is used to apply heat to the chip package 102. The heat source 120 can include any suitable device, as such devices are commercially available and well known to those skilled in the art of semiconductor device analysis. In one embodiment, the heat source 120 includes a heater block as the same are used by and commercially available to those working in the field. The heat source 120 is placed in contact with the chip package 102. Applying heat to the chip package comprise applying sufficient heat such that the underfill region 108 can transform to the liquid state but that the components located in the circuit region 102 are not damaged. A cutting tool is used to cut around portions of the circuit region 101 in order to initiate a separation of the flip chip die 100 from the underfill region 108. The cutting tool can include any suitable device, as such cutting tools are commercially available and well known to those skilled in the art of semiconductor device analysis.

Figure 1D:
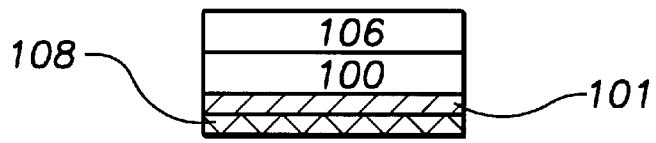

Next, FIG. 1D illustrates the structure following the next series of steps. A pressure is applied to at least one of the opposing edges 111. The pressure can be applied with any tool suited for the same. Those skilled in the art are familiar with tools suited for applying pressure to the edge of a silicon die. Such tools are, likewise, commercially available. A sufficient pressure is applied to the edge 111 of the flip chip die 100 such that the flip chip die slides removably off of the chip package 102. The structure is now as is illustrated in FIG. 1D. All of the chip package 102 has been removed and the underfill region 108 is exposed. From this stage forward, the circuit region 101 is readily accessible for analysis. The underfill region 108 is removed using conventional methods, which are well known by those in the art.

Figure 2:
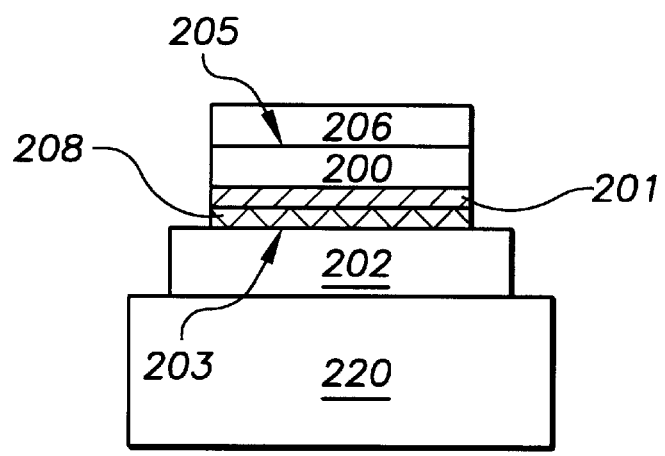
FIG. 2 illustrates a device for removing a flip chip die from packaging according to the present invention.

The present invention includes numerous variations to the embodiment described above. FIG. 2 illustrates a device for accessing flip chip circuitry according to the present invention. The device includes a chip package 202. The chip package 202 has electrical connections to a circuit region 201 on flip chip die 200. In one embodiment, the circuit region 201 is electrically connected to the chip package using a ball grid array (BGA) technique, as this method is well practiced in the art. In an alternative embodiment, the circuit region 201 of the flip chip die 200 is electrically connected using any other suitable method. Such alternative methods are well known and practiced by those skilled in the art. An underfill region 208 encases the circuit region 201 and fills the boundary between the circuit region 201 and the chip package 202. The electrical pin connections, as would typically be present for connecting the chip package 202 to external devices, have been removed.

The circuit region 201 is located on a front side 203 of the flip chip die 200. The flip chip die 200 is oriented such that the circuit region 201 is adjacent to, or "faces," the chip package 202. The flip chip die 200 further includes a back side 205. A back plate 206 is attached to the back side 205 of the flip chip die 200. The back plate 206 comprises a silicon carcass salvaged from a discarded silicon die. Such silicon carcasses are remnants of old wafers, and are therefore sufficiently available, often even pre-cut to the right size. Attachment of the back plate 206 to the back side 205 of the flip chip die 200 is achieved using any suitable adhesive, as such adhesive are generally used and known to those working in the in the semiconductor device analysis field. In one embodiment, the chip package 202 is formed from ceramic. In another embodiment, the chip package 202 is formed of any suitable material for supporting and protecting the flip chip die 200 as well as facilitating electrical connections to the circuit region 201.

A heat source 220 is in contact with the chip package 202. The heat source 220 is used to apply heat to the chip package 202. The heat source 220 can include any suitable device, as such devices are commercially available and well known to those skilled in the art of semiconductor device analysis. In one embodiment, the heat source 220 includes a heater block as the same are used by and commercially available to those working in the field.

Figure 3:
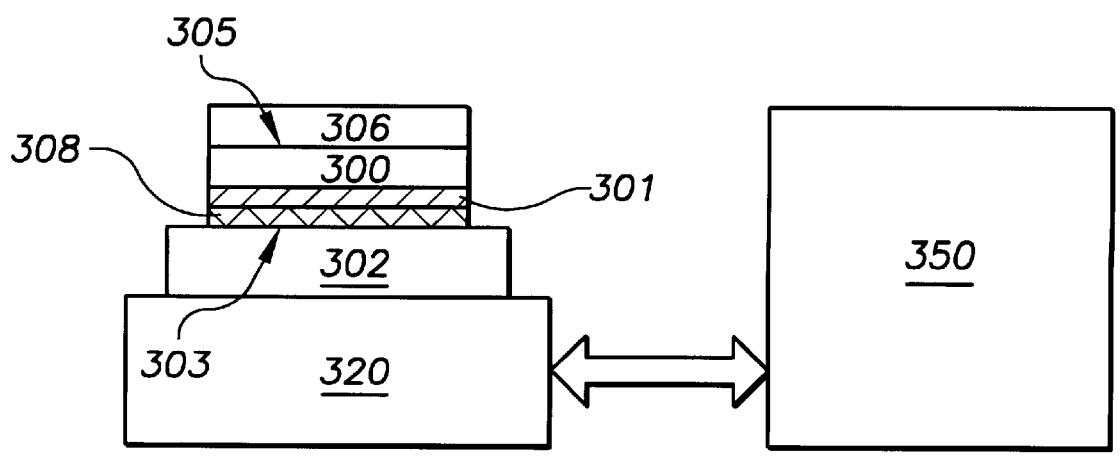
FIG. 3 is a block diagram of a system in accordance with an embodiment of the present invention.

FIG. 3 is a block diagram of a system in accordance with an embodiment of the present invention. FIG. 3 illustrates a controller 350. By way of example, the controller includes an electrical controller. In one embodiment, the controller 350 includes a micro controller as the same are readily accessible for industry needs. In another embodiment, the controller includes a central processing unit (CPU) as part of a computer operated tool configuration. Other types of controllers are well known to those in the art and would be equally suited for use in the present invention. The controller 350 is electrically coupled to a heat source 320 and suited for controlling the operation of the heat source 320. The heat source 320 includes those embodiments for a heat source which were presented previously. The heat source 320 is in contact with a chip package 302. The chip package 302 comprises all of the structural organization as the device presented above with the backplate 306 being engaged using a die separation tool 322.

Thus, the present invention provides an efficient and more effective and method and device for accessing the circuit region on a flip chip die. The method and device allow for accessing multiple portions of the circuit region simultaneously or in sequence. In this manner, portions of the circuit region can be tested and analyzed together and others separately. Access to the circuit region is gained without deteriorating any portions of the circuit region in the process. In a similar fashion, the new method and device allow for the circuit region to be efficiently modified, or "debugged," and then returned into operation.

Although specific embodiments have been illustrated and described herein, it is appreciated by those of ordinary skill in the art that any arrangement which is calculated to achieve the same purpose may be substituted for the specific embodiments shown.

Therefore, it is manifestly intended that this invention be limited only by the claims and the equivalents thereof.

What is claimed is:

1. An arrangement for accessing a circuit region on a flip chip die attached to a package substrate, the arrangement comprising:
  a chip package having electrical connections to the circuit region, the chip package having no electrical pin connections for external device connection;
  a backplate attached to the flip chip die;
  a heat source placed in contact with the chip package and adapted to heat the die; and
  a separation device adapted to apply pressure to the backplate and remove the die from the package substrate.

2. The device of claim 1, wherein the backplate is attached to a backside of the flip chip die, the circuit region of the flip chip die being located on a front side of the flip chip die and attached to the chip package.

3. The device of claim 2, wherein the flip chip die further comprises an underfill region, the underfill region encasing the circuit region.

4. The arrangement of claim 1, further comprising a removal device adapted to remove portions of the package from outside a circuit region of the flip chip die.

5. The arrangement of claim 4, wherein the removal device is adapted to remove a number of electrical pin connections from the chip package.

6. The arrangement of claim 4, wherein the removal device includes a diamond saw adapted to remove portions of the chip package.

7. The arrangement of claim 4, wherein the backplate is adapted to attach to a backside of the flip chip die, the circuit region of the flip chip die being located on a front side of the flip chip die and attached to the chip package.

8. The arrangement of claim 4, wherein the removal device is adapted to cut around portions of the circuit region of the flip chip die in order to initiate a separation of the flip chip die from an underfill region between the flip chip die and the package.

9. The arrangement of claim 8, wherein the heat source is adapted to sufficiently heat the chip package such that the underfill region turns to a liquid state without deteriorating the circuit region of the flip chip die.

10. The arrangement of claim 1, wherein the separation device is adapted to apply a pressure to an edge of the flip chip die.

11. The arrangement of claim 1, wherein the separation device is adapted to apply sufficient pressure to an edge of the flip chip die such that the flip chip slides removably off of the package substrate.

12. The arrangement of claim 1, wherein the heat source includes a heater block.

13. The arrangement of claim 1, wherein the backplate includes a silicon carcass from a discarded die.

14. A device for accessing a circuit region on a flip chip die, comprising:
  a ceramic chip package, the chip package having, electrical connections to the circuit region, the chip package having no electrical pin connections for external device connection;
  a backplate attached to the flip chip die, wherein the backplate is a silicon carcass from a discarded die; and
  a heat source placed in contact with the chip package.

15. A device for accessing a circuit region on a flip chip die, comprising:
  a chip package, the chip package having electrical connections to the circuit region, the chip package having no electrical pin connections for external device connection;
  a backplate attached to the flip chip die, wherein the backplate is a silicon carcass from a discarded die; and
  a heater block placed in contact with the chip package.

16. A system for accessing a circuit region on a flip chip die, comprising:

a device for accessing the circuit region, the device comprising:
- a chip package, the chip package having electrical connections to the circuit region, the chip package having no electrical pin connections for external device connection;
- a backplate attached to the flip chip die, wherein the backplate is a silicon carcass from a discarded die; and
- a heat source, the heat source in contact with the chip package; and
- a controller electrically coupled to the heat source for controlling the operation of the heat source.

17. The system of claim 16, wherein the backplate is attached to a backside of the flip chip die, the circuit region of the flip chip die being located on a front side of the flip chip die and attached to the chip package.

18. The system of claim 17, wherein the flip chip die further comprising an underfill region that encases the circuit region.

19. The system of claim 16, wherein the chip package is a ceramic package.

20. The system of claim 16, wherein the heat source is a heater block.

* * * * *